United States Patent
Nishikawa et al.

(10) Patent No.: US 7,274,543 B2
(45) Date of Patent: Sep. 25, 2007

(54) OVER-VOLTAGE PROTECTION CIRCUIT

(75) Inventors: Mutsuo Nishikawa, Nagano (JP);
Katsumichi Ueyanagi, Nagano (JP);
Katsuyuki Uematsu, Nagano (JP);
Akio Kitamura, Nagano (JP)

(73) Assignee: Fuji Electric Co., Ltd., Kawasaki (JP)

( * ) Notice: Subject to any disclaimer, the term of this patent is extended or adjusted under 35 U.S.C. 154(b) by 0 days.

(21) Appl. No.: 10/401,751

(22) Filed: Mar. 31, 2003

(65) Prior Publication Data

US 2003/0214769 A1    Nov. 20, 2003

(30) Foreign Application Priority Data

Apr. 9, 2002    (JP) ............... 2002-107185

(51) Int. Cl.
*H02H 9/00* (2006.01)
(52) U.S. Cl. .................................... 361/56
(58) Field of Classification Search ............. 361/56, 361/91, 111, 92; 257/355
See application file for complete search history.

(56) References Cited

U.S. PATENT DOCUMENTS 3,048,718 A * 8/1962 Starzec et al. ......... 361/91.6
5,905,621 A * 5/1999 Drapkin ................... 361/111
6,538,866 B1   3/2003 Hanzawa et al.

FOREIGN PATENT DOCUMENTS

| JP | 06-245366 | 9/1994 |
| JP | 9-307361 | 11/1997 |
| JP | 10170581 A * | 6/1998 |

* cited by examiner

*Primary Examiner*—Michael Sherry
*Assistant Examiner*—Boris Benenson
(74) *Attorney, Agent, or Firm*—Manabu Kanesaka

(57) ABSTRACT

An over-voltage protection circuit for protecting an integrated circuit includes an external power supply terminal to which a power supply voltage is supplied, a grounding terminal to which a ground voltage is supplied, and an internal power supply terminal for supplying the power supply voltage to the integrated circuit. A voltage dividing unit is connected between the external power supply terminal and the grounding terminal for dividing a voltage supplied from the external power supply terminal, and has a Zener diode and a first resistor connected in series. A signal generating unit is connected between the external power supply terminal and the grounding terminal for outputting the power supply voltage or the ground voltage, and a switching unit is connected between the internal power supply terminal and the signal generating unit for performing a switching operation.

4 Claims, 5 Drawing Sheets

OVER-VOLTAGE PROTECTION CIRCUIT

BACKGROUND OF THE INVENTION AND RELATED ART STATEMENT

The present invention relates to an over-voltage protection circuit for protecting a CMOS integrated circuit used in an electric apparatus or an electronic device for automotive, medical or industrial application, or the like, from an over-voltage or surge applied from a power supply. More specifically, the present invention relates to an over-voltage protection circuit that can be formed together with the CMOS integrated circuit on the same semiconductor substrate.

Various over-voltage protection circuits have been used in a control system mounted on a vehicle, and in an electronic part such as an integrated circuit in the control system. The electronic part for the automobile is used in an environment where a power supply voltage tends to vary greatly. Therefore, it is necessary to prevent a malfunction or damage caused by the variation of the power supply voltage.

A conventional over-voltage protection circuit is formed of external elements such as a Zener diode, a resistor and the like mounted to an IC chip to be protected. As a result, due to the Zener diode and resistors, an increased number of parts and extensive labor are needed to assemble the protection circuit, resulting in a higher cost. Recently, an over-voltage protection circuit using a bipolar transistor provided in an IC chip has been proposed (for example, Japanese Patent Publication (KOKAI) No. 06-245,366).

In such a conventional over-voltage protection circuit, an additional process for manufacturing Bi-CMOS is needed, thereby increasing a manufacturing cost. Moreover, the protection circuit includes a large number of elements. Further, in order to accommodate a higher power supply voltage, a large number of elements are required to have a higher breakdown voltage. Accordingly, the protection circuit requires a larger circuit area, thereby making the manufacturing process complicated and increasing a manufacturing cost.

The present invention has been made in view of the problems described above, and an object of the present invention is to provide an over-voltage protecting circuit integrated with an integrated circuit on the same semiconductor substrate, thereby reducing the number of the elements.

Further objects and advantages of the invention will be apparent from the following description of the invention.

SUMMARY OF THE INVENTION

In order to achieve the above-described object, according to the present invention, an over-voltage protection circuit includes an external power supply terminal to which a power supply voltage is supplied from outside; a grounding terminal to which a ground voltage is supplied from outside; an internal power supply terminal for supplying the power supply voltage supplied from outside to an integrated circuit as an object to be protected; voltage dividing means connected between the external power supply terminal and the grounding terminal, and formed of a series circuit in which a Zener diode is connected to a resistor element for dividing a voltage supplied from the external power supply terminal; signal generating means connected between the external power supply terminal and the grounding terminal; and switching means.

The signal generating means is provided with an inverter circuit formed of a series circuit in which a resistor element is connected to the first high breakdown voltage MOS transistor in series. The first high breakdown voltage MOS transistor has a gate terminal thereof as an input terminal and a drain terminal as an output terminal. The gate terminal outputs one of the power supply voltage and the ground voltage depending on a voltage at a connection point of the Zener diode and the resistor element in the voltage dividing means. The switching means is provided with the second high breakdown voltage MOS transistor for performing a switching operation depending on an output of the signal generating means. The second high breakdown voltage MOS has a source terminal connected to the external power supply terminal, a drain terminal connected to the internal power supply terminal, and a gate terminal connected to an output terminal of the signal generating means. The voltage dividing means, the signal generating means and the switching means are formed on a semiconductor substrate on which the integrated circuit to be protected is formed.

According to the invention, together with the integrated circuit as an object to be protected, the semiconductor substrate is provided with the voltage dividing means for dividing the voltage supplied from outside, the signal generating means for receiving a voltage at a voltage dividing point of the voltage dividing unit, and the switching means for shutting off an over-voltage from being supplied to the integrated circuit.

The signal generating means and the switching means include the high breakdown voltage MOS transistors. Thus, it is easy to make the over-voltage protection circuit with a high breakdown voltage. In this case, when a power supply voltage supplied from outside becomes equal to or more than a breakdown voltage of the Zener diode, breakdown of the Zener diode occurs to cramp a voltage at the voltage dividing point to a breakdown voltage Vr of the Zener diode. Accordingly, when the P-type high breakdown voltage MOS transistor constituting the switching means switches from an ON state to an OFF state (or from an OFF state to an ON state). The power supply voltage is defined as Vth+Vr, wherein Vth is a threshold voltage of the high breakdown voltage MOS transistor constituting the signal generating means.

PREFERRED EMBODIMENTS OF THE INVENTION

Hereunder, embodiments of the present invention will be explained with reference to the accompanying drawings.

Figure 1:
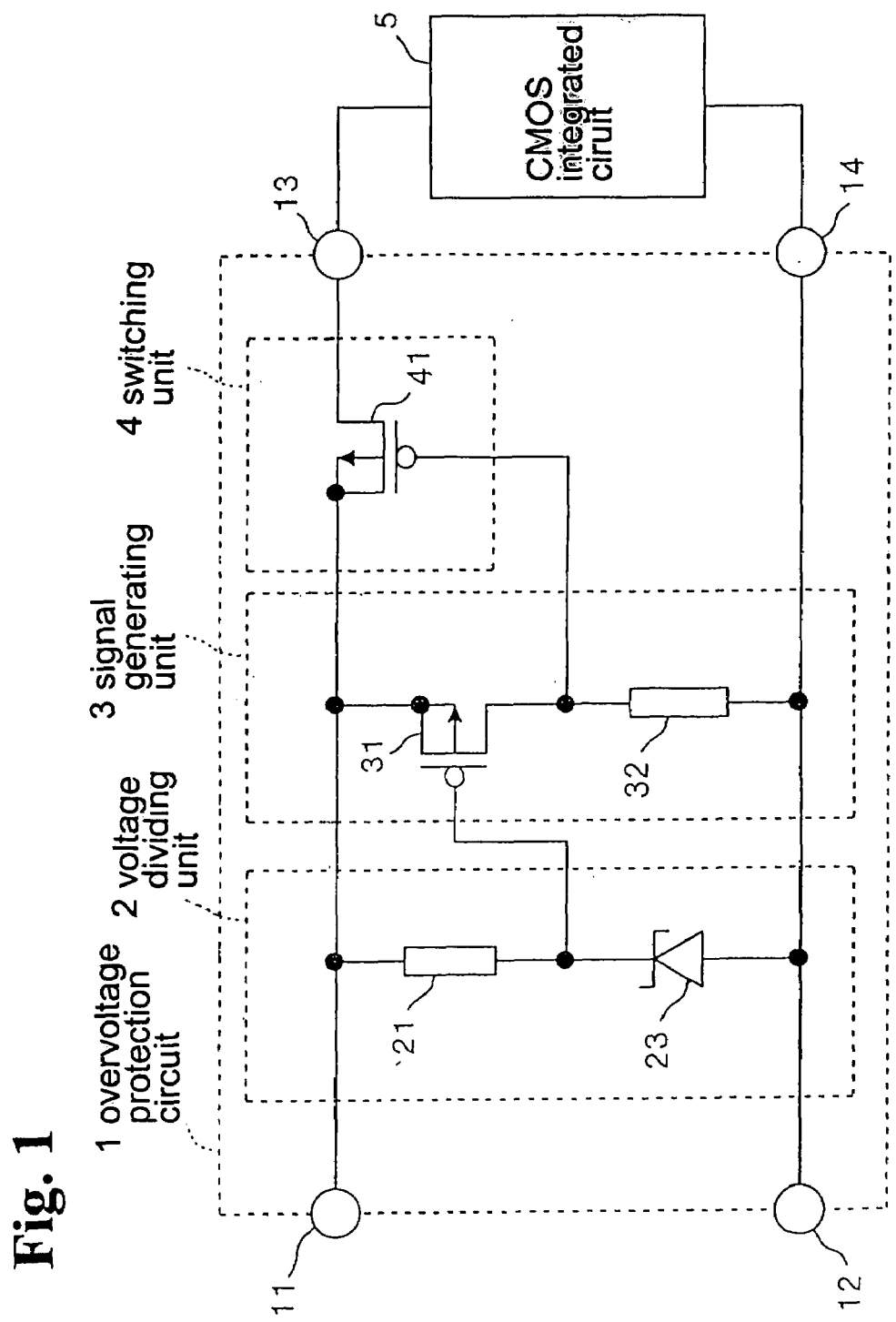
FIG. 1 is a circuit diagram showing a configuration of an over-voltage protection circuit according to an embodiment of the invention.

FIG. 1 is a circuit diagram showing a configuration of an over-voltage protection circuit according to an embodiment of the invention. An over-voltage protection circuit 1 is provided with voltage dividing means 2, signal generating means 3, and switching means 4 on a semiconductor substrate on which a CMOS integrated circuit 5 as an object to be protected is formed.

As shown in FIG. 1, a reference numeral 11 denotes an external power supply terminal to which a power supply voltage is supplied from outside. A reference numeral 12 denotes a grounding terminal to which a ground voltage is supplied from outside. A reference numeral 13 denotes an internal power supply terminal for supplying the power supply voltage applied to the external power supply terminal 11 to the CMOS integrated circuit 5. A reference numeral 14 denotes a grounding terminal for supplying the ground voltage to the CMOS integrated circuit 5.

The voltage dividing means 2 is provided with, for example, the first resistor element 21 and a Zener diode 23. An end of the first resistor element 21 is connected to the external power supply terminal 11, and the other end thereof is connected to a cathode terminal of the Zener diode 23. An anode terminal of the Zener diode 23 is connected to the grounding terminals 12 and 14.

The signal generating means 3 is provided with, for example, the first P-type high breakdown voltage MOS transistor (hereinafter referred to as the first PDMOS) 31 and the second resistor element 32. A source terminal of the first PDMOS 31 is connected to the external power supply terminal 11, and a gate terminal thereof is connected to the cathode terminal of the Zener diode 23, that is a voltage dividing point of the voltage dividing unit 2. A drain terminal of the first PDMOS 31 is connected to an end of the second resistor element 32. The other end of the second resistor element 32 is connected to the grounding terminals 12 and 14.

The switching means 4 is provided with, for example, the second P-type high breakdown voltage MOS transistor (hereinafter referred to as the second PDMOS) 41. A source terminal of the second PDMOS 41 is connected to the external power supply terminal 11, and a gate terminal thereof is connected to the drain terminal of the first PDMOS 31. A drain terminal of the second PDMOS 41 is connected to the internal power supply terminal 13.

Figure 2:
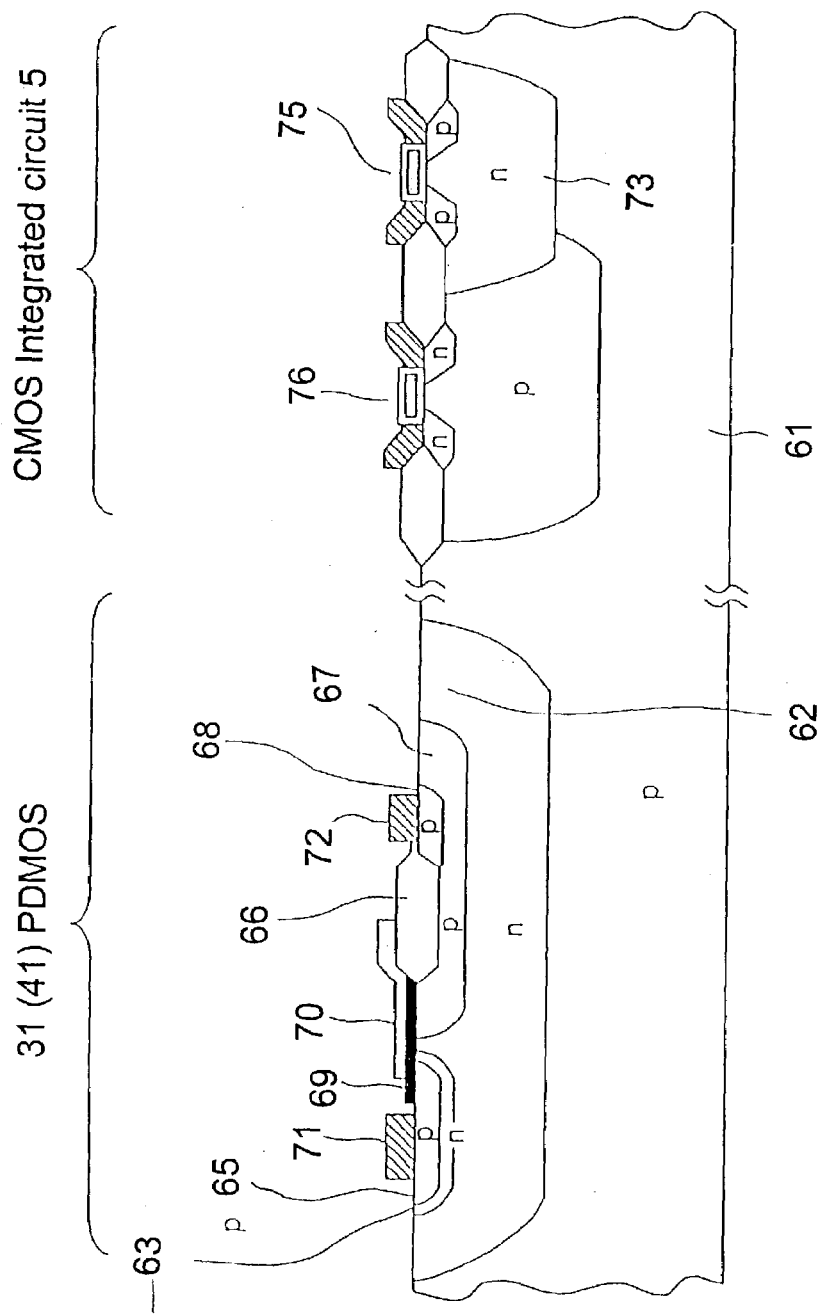
FIG. 2 is a sectional view showing an example of a P-type high breakdown voltage MOS transistor constituting the over-voltage protection circuit according to the embodiment of the invention.

Next, structures of the first PDMOS 31 and the second PDMOS 41 will be explained. FIG. 2 is a cross sectional view showing an example of the P-type high breakdown voltage MOS transistor forming the over-voltage protection circuit according to the embodiment of the invention. A left side of FIG. 2 is a vertical cross sectional view showing an example of a structure of the PDMOS 31 or 41. A right side of FIG. 2 is a vertical cross sectional view showing an n-channel MOSFET 76 and a P-channel MOSFET 75 in the CMOS integrated circuit 5 integrated on a semiconductor substrate on which the PDMOS 31 or 41 is formed.

An n-well region 62 is formed on a main surface of a p-type substrate 61. A p-offset region 67 and a p-source region 65 are formed on a surface of the n-well region 62 with an interval in between. A thick oxide film (LOCOS) 66 is selectively formed on a part of a surface of the p-offset region. A p-drain region 68 is formed on a surface of the p-offset region at a position opposite to the p-source region 65 with the oxide film 66 in between.

In the n-well region 62, an n-base region 63 with an impurity concentration higher than that of the n-well region 62 is formed at an outside of the p-source region 65. In FIG. 2, a reference numeral 69 denotes a gate oxide film, a reference numeral 70 denotes a gate electrode, a reference numeral 71 denotes a source electrode, and a reference numeral 72 denotes a drain electrode.

The n-well region 62 of the PDMOS 31 or 41 is simultaneously formed with an n-well region 73 of the p-channel MOSFET 75. Furthermore, the p-offset region 67 and the n-base region 63 of the PDMOS 31 or 41 can be simultaneously formed with the first and second resistor elements 21, 32 and resistor elements in the CMOS integrated circuit 5.

Therefore, it is possible to eliminate an exclusive mask and a step of ion implantation for forming the n-well region 62, the p-offset region 67, and the n-base region 63 in the PDMOS 31 or 41. The PDMOS 31 or 41 can be manufactured without the exclusive mask and the additional step. Thus, the over-voltage protection circuit 1 is manufactured simultaneously with the CMOS integrated circuit 5.

Figure 4:
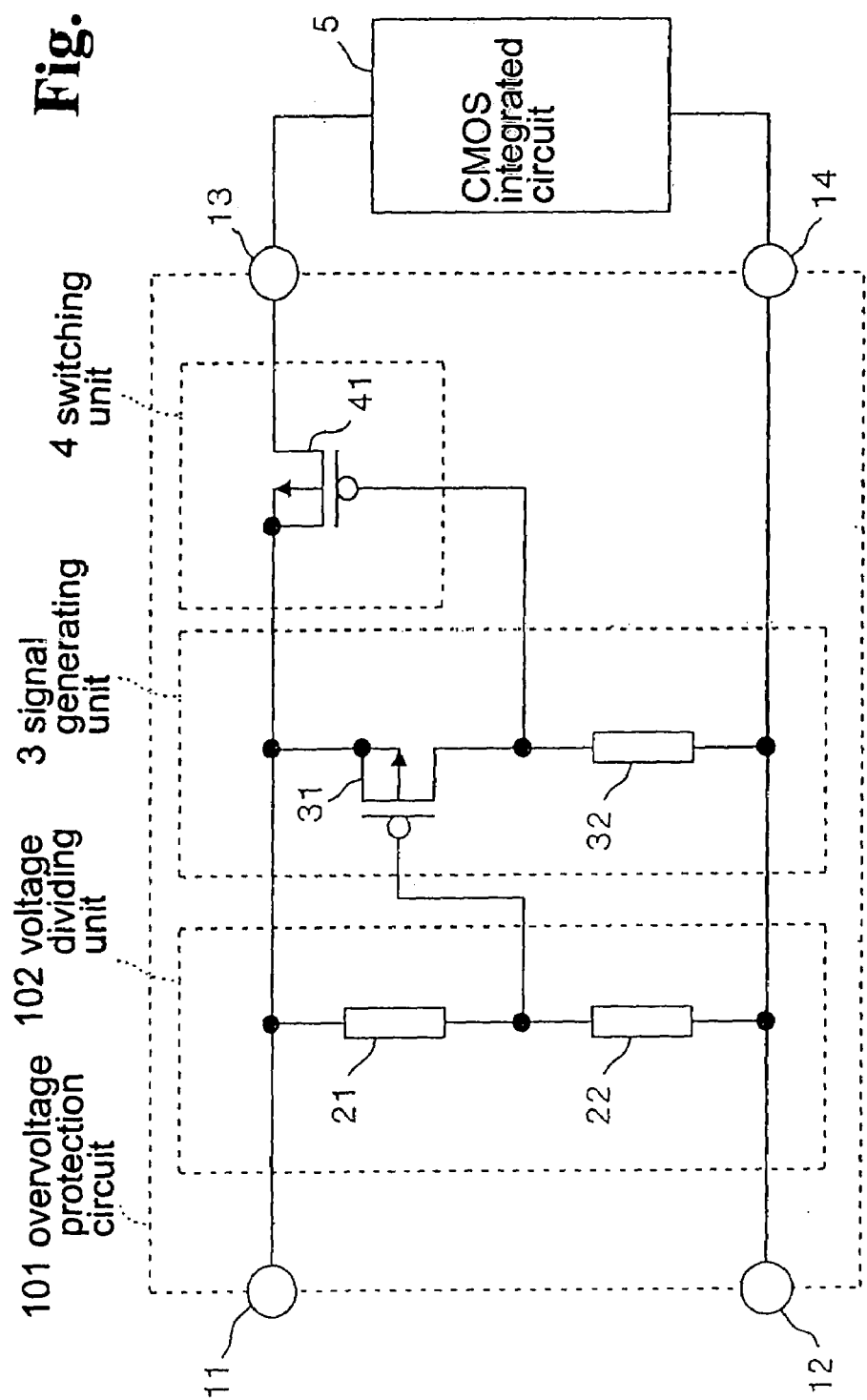
FIG. 4 is a circuit diagram showing an arrangement of a conventional over-voltage protection circuit.

In order to differentiate the overvoltage protection circuit 1 of the present invention from a prior invention (not prior art), an over-voltage protection circuit disclosed in Japanese Patent Application No. 2001-116064, which corresponds to U.S. patent application Ser. No. 10/123,023 filed on Apr. 15, 2002, will be explained next. FIG. 4 is a circuit diagram showing an arrangement of the over-voltage protection circuit proposed in Japanese Patent Application No. 2001-116064. As shown in FIG. 4, an over-voltage protection circuit 101 has a resistor element 22 in voltage dividing means 102 instead of the Zener diode 23 in the embodiment of the invention shown in FIG. 1. Other configurations in FIG. 4 are the same as those in FIG. 1. Thus, the same reference numerals are used for the components same as those in FIG. 1, and the explanations thereof are omitted.

An operation of the prior over-voltage protection circuit 101 will be explained. A power supply voltage (hereinafter referred to as a voltage Vcc) applied to an external power supply terminal is divided by voltage dividing means 102. The divided voltage (hereinafter referred to as a voltage Vdiv) is applied to a gate terminal of the first PDMOS 31.

When an absolute value of a difference between the voltage Vcc and the voltage Vdiv is small, that is, the voltage Vcc is small, a drain output voltage of the first PDMOS 31 becomes approximately equal to a ground voltage (hereinafter referred to as a GND voltage) supplied from a grounding terminal 12. Thus, the second PDMOS 41 becomes an ON state, and the voltage Vcc is supplied to an internal power supply electrode 13.

When the absolute value of the difference between the voltage Vcc and the voltage Vdiv is large, that is, the voltage Vcc is large, the drain output voltage of the first PDMOS 31 becomes approximately equal to the voltage Vcc. Thus, the second PDMOS 41 becomes an OFF state, and the internal power supply electrode 13 is disconnected from the external power supply terminal 11, thereby supplying no voltage Vcc to the internal power supply terminal 13. That is, the voltage Vcc is shut off. Through such an operation, the voltage Vcc is controlled to supply to the CMOS integrated circuit 5 or to be shut off.

In the over-voltage protection circuit 101 with the arrangement shown in FIG. 4, for protecting the CMOS integrated circuit 5 from an over-voltage inputted from the external power supply terminal 11, an operating point (the voltage Vcc) for switching from a supplying state of the power supply voltage to a shutting off state thereof (or from the shutting off state to the supplying state) is set equal to or less than the maximum rated voltage of the CMOS integrated circuit 5. Accordingly, it is possible to prevent a voltage beyond the maximum rated voltage from being applied to the CMOS integrated circuit 5.

The voltage Vcc for switching the second PDMOS from the ON state to the OFF state (or from the OFF state to the ON state) (hereinafter referred to as an over-voltage threshold voltage Vovp) is expressed by the following equation, $$Vovp = Vth \times (R1+R2)/R1$$

where Vth is a threshold voltage of the first PDMOS 31, R1 and R2 are resistivity of the resistor element 21 and the resistor element 22 of the voltage dividing means 102, respectively.

The equation shown above is an approximate expression obtained from the fact that the absolute value of the difference between the voltage Vcc and the voltage Vdiv for switching the drain output voltage of the first PDMOS 31 from the GND voltage to the Vcc voltage (or from the Vcc voltage to the GND voltage) is approximately the value of the threshold voltage of the first PDMOS 31.

As is apparent from the equation above, in the prior over-voltage protection circuit 101, the over-voltage threshold voltage Vovp is a value of the threshold voltage Vth of the first PDMOS 31 multiplied by (R1+R2)/R1. Accordingly, the threshold voltage Vth of the first PDMOS 31 has a variation due to a manufacturing process and a temperature characteristic multiplied by (R1+R2)/R1, thereby enlarging an effect on the over-voltage threshold voltage Vovp.

Therefore, in the prior over-voltage protection circuit 101, the over-voltage threshold voltage Vovp tends to have a large initial variation and large temperature dependence. As a measure to reduce this effect, it is necessary to use a PDMOS having a threshold voltage with a small initial variation and a small temperature dependence, that is, a high accuracy PDMOS. Using the high accuracy PDMOS increases a manufacturing cost.

Next, an operation of the over-voltage protection circuit 1 of the embodiment will be explained with reference to FIG. 1. In the over-voltage protection circuit 1 shown in FIG. 1, when the Vcc voltage applied to the external power supply terminal 11 is lower than the breakdown voltage Vr of the Zener diode 23, a voltage Vdiv divided from the voltage Vcc output from the voltage dividing unit 2 is approximately equal to the voltage Vcc. Therefore, an absolute value of a difference between the voltage Vcc and the voltage Vdiv is small.

Accordingly, a drain output voltage of the first PDMOS 31 is approximately equal to the GND voltage, and the second PDMOS 41 is in the ON state, so that the Vcc voltage is supplied to the internal power supply terminal 13.

When the Vcc voltage becomes equal to or more than the breakdown voltage Vr, a breakdown of the Zener diode 23 occurs, and the voltage Vdiv is cramped at the breakdown voltage Vr. The absolute value of the difference between the voltage Vcc and the voltage Vdiv (=Vr) becomes larger, and the drain output voltage of the first PDMOS 31 becomes approximately equal to the voltage Vcc. Therefore, the second PDMOS 41 is in the OFF state to shut off the supply of the voltage Vcc to the internal power supply terminal 13.

In the over-voltage protection circuit 1 (FIG. 1) of the invention, the over-voltage threshold voltage Vovp is a sum of the threshold voltage Vth of the first PDMOS 31 and the breakdown voltage of the Zener diode 23. That is, the over-voltage threshold voltage Vovp is defined by the following equation, $$Vovp = Vth + Vr$$

Therefore, according to the embodiment, variations due to manufacturing conditions and temperature dependence of the threshold voltage Vth of the first PDMOS 31 affect the over-voltage threshold voltage Vth without being amplified. Thus, the initial variations and the temperature dependence in the over-voltage threshold voltage Vovp are smaller than those in the conventional over-voltage protection circuit 101 shown in FIG. 4.

Figure 3:
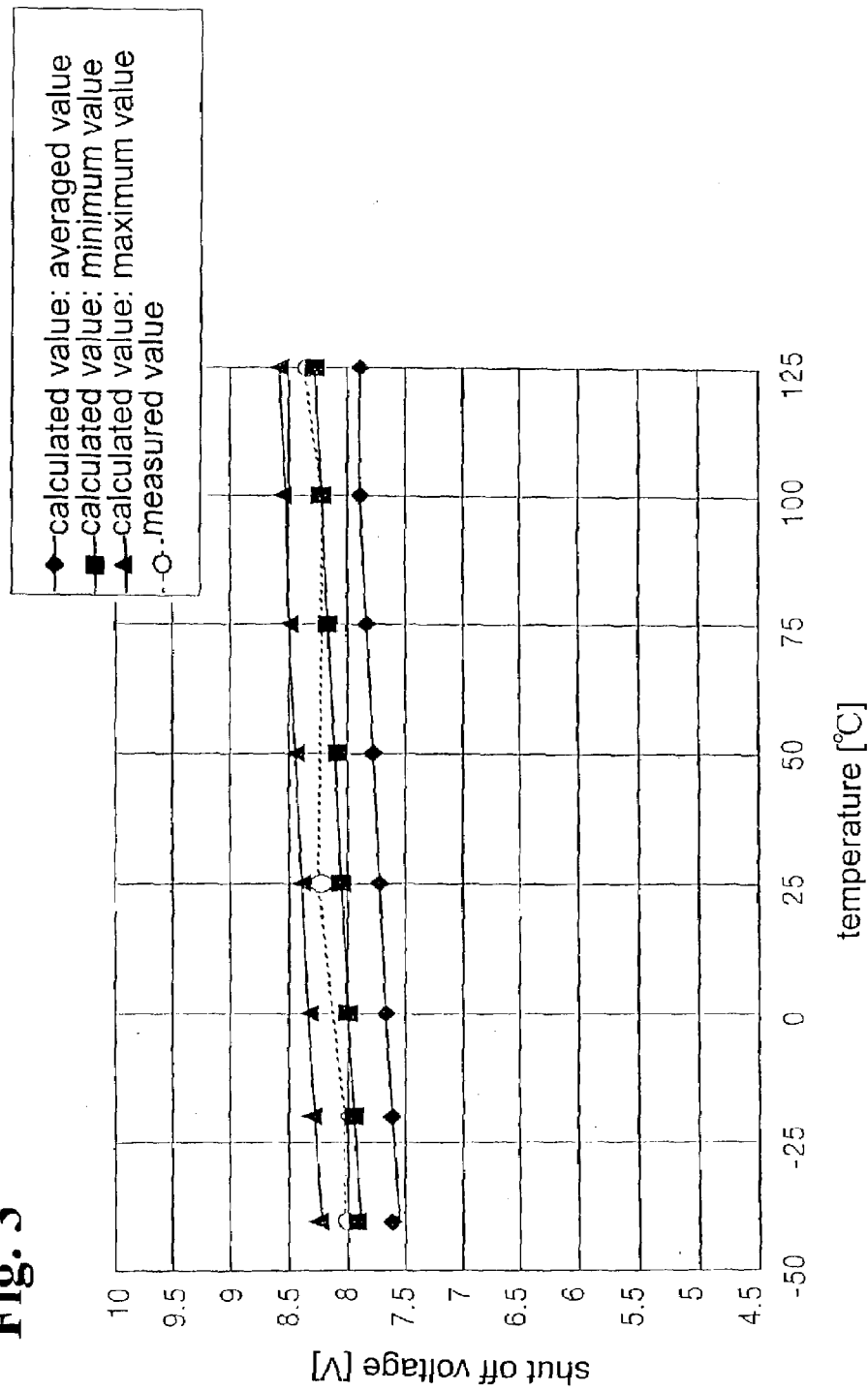
FIG. 3 is a diagram showing calculated and measured over-voltage threshold voltages of the over-voltage protection circuit according to the embodiment of the invention.
Figure 5:
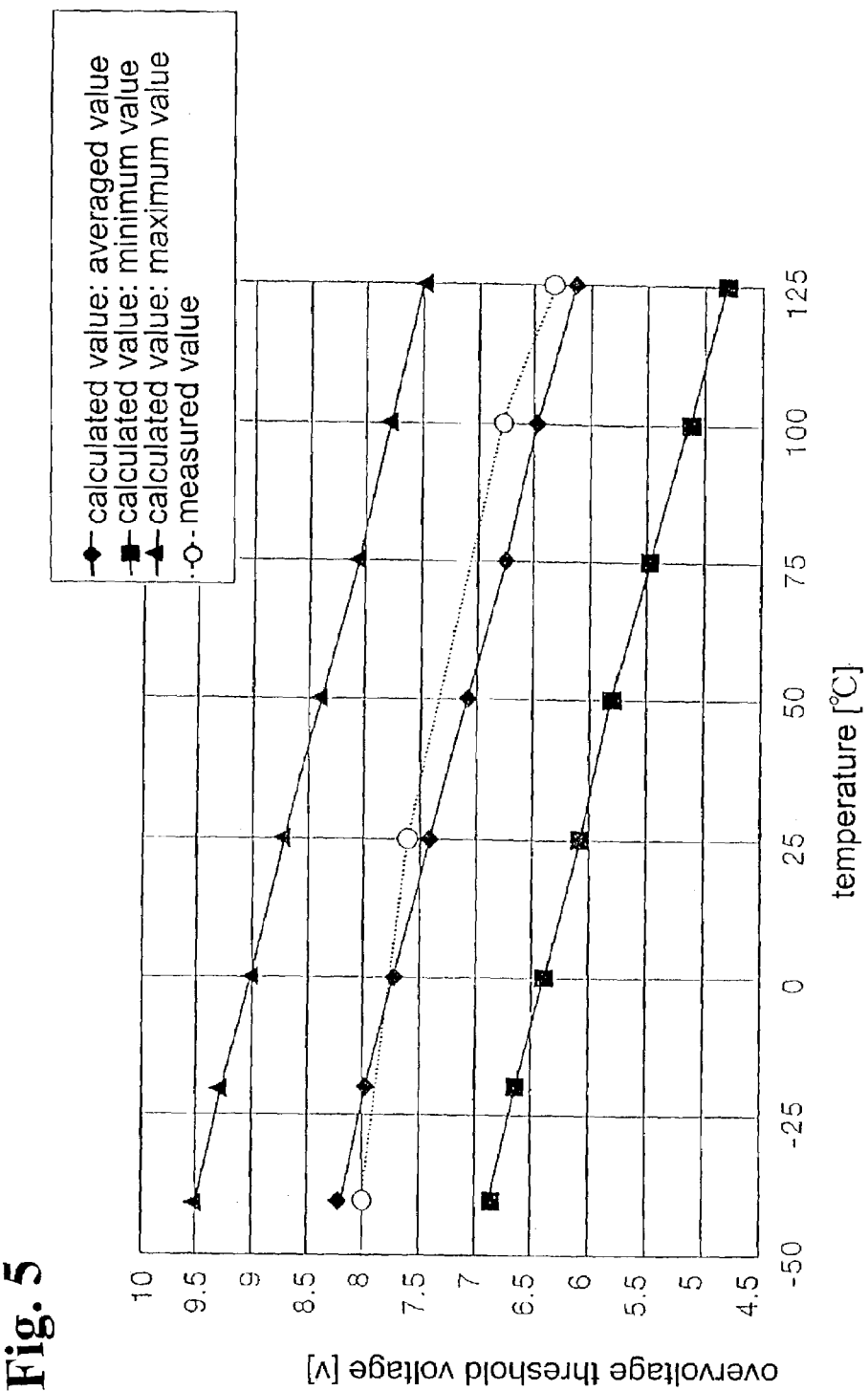
FIG. 5 is a diagram showing calculated and measured over-voltage threshold voltages of the conventional over-voltage protection circuit.

In order to verify effectiveness of the embodiment, the over-voltage threshold voltage Vovp at various temperatures was calculated for the over-voltage protection circuit 1 shown in FIG. 1 and the prior over-voltage protection circuit 101 shown in FIG. 4. In addition, the over-voltage threshold voltages Vovp at various temperatures were measured for the actual circuits. FIG. 3 shows the calculated and measured results for the over-voltage protection circuit 1 according to the embodiment of the present invention. FIG. 5 shows the calculated and measured results of the prior over-voltage protection circuit 101.

As seen in the comparison between FIG. 3 and FIG. 5, it is revealed that the initial variation of the over-voltage threshold voltage Vovp of the over-voltage protection circuit 1 is equal to or less than a half of that of the over-voltage threshold voltage Vovp of the prior over-voltage protection circuit 101. That is, according to the invention, the initial variation of the over-voltage threshold voltage Vovp can be equal to or less than a half of that of the prior over-voltage protection circuit 101.

Furthermore, as seen in the comparison between FIG. 3 and FIG. 5, it is found that the temperature dependence of the over-voltage threshold voltage Vovp is improved from that of the prior over-voltage protection circuit 101. The over-voltage threshold voltages Vovp is almost constant at 8.0 to 8.3 V at various temperatures shown in FIG. 3, while the voltages vary between 8.0 and 6.3 V in FIG. 5.

When the over-voltage protection circuit 1 (FIG. 1) and the prior over-voltage protection circuit 101 (FIG. 4) were manufactured for the evaluation, they were formed simultaneously on the same wafer with the same manufacturing process. Therefore, it can be considered that there is no difference in conditions relating to the manufacturing process, the manufacturing lot, and the wafer in the results of the evaluation. The same values were used for characteristic constants of the elements in the calculations shown in FIG. 3 and FIG. 5. Then, variations among elements due to the differences in lots and wafers were taken into consideration to obtain minimum and maximum values of the calculated results.

According to the embodiment, the over-voltage protection circuit 1 can be formed on the semiconductor substrate along with the CMOS integrated circuit 5 as an object to be protected, thereby reducing the number of elements and achieving a low cost. Further, it is possible to minimize the influence of the variation in the threshold voltage Vth of the first PDMOS 31 when the second PDMOS 41 switches from the ON state to the OFF state (or from the OFF state to the ON state). Therefore, it is not necessary to use the expensive high accuracy PDMOS having a small initial variation in threshold voltage and temperature dependence, thereby further reducing the cost.

Incidentally, the numerical values shown in FIG. 3, FIG. 4, and related explanations are presented just as an example, and the invention is not limited to those values.

According to the invention, along with the integrated circuit as an object to be protected, the voltage dividing means or unit for dividing the voltage supplied from outside, the signal generating means or unit for receiving the voltage at the voltage dividing point in the voltage dividing unit as an input, and the switching means or unit for shutting off the over-voltage from being supplied to the integrated circuit are manufactured on the same semiconductor substrate. Therefore, the over-voltage protection circuit can be formed with a small number of the elements and is therefore inexpensive.

Further, according to the invention, it is easy to make the over-voltage protection circuit have a high breakdown voltage. According to the invention, the power supply voltage is equal to Vth+Vr, when the PDMOS in the switching unit switches from the ON state to the OFF state (or from the OFF state to the ON state), where Vth is the threshold voltage of the PDMOS in the signal generating unit. Therefore, it is possible to minimize the influence of the variation in the threshold voltage Vth of the first PDMOS in the signal generating unit at the transition. Therefore, it is not necessary to use the high accuracy PDMOS with small variation and temperature dependence, thereby reducing the cost.

While the invention has been explained with the specific embodiments of the invention, the explanation is illustrative and the invention is limited only by the appended claims.

What is claimed is:

1. An over-voltage protection circuit for protecting an integrated circuit from an over-voltage, comprising:
   an external power supply terminal to which a power supply voltage is supplied,
   a grounding terminal to which a ground voltage is supplied,
   an internal power supply terminal for supplying a power supply voltage to the integrated circuit,
   voltage dividing means connected between the external power supply terminal and the grounding terminal for dividing the voltage supplied from the external power supply terminal, said voltage dividing means consisting of one Zener diode and one first resistor connected in series,
   signal generating means connected between the external power supply terminal and the grounding terminal for outputting one of the power supply voltage and the ground voltage depending on a voltage at a connection point of the Zener diode and the first resistor in the voltage dividing means, and
   switching means connected between the internal power supply terminal and the signal generating means for performing an on/off switching operation depending on an output of the signal generating means,
   wherein said voltage dividing means, said signal generating means and said switching means are formed on a semiconductor substrate on which the integrated circuit is formed, and
   wherein said signal generating means includes an inverter circuit formed of a second resistor and a first high breakdown voltage MOS transistor connected in series, said first high breakdown voltage MOS transistor having a first source terminal connected to the external power supply terminal, a first gate terminal connected to the voltage dividing means as an input terminal, and a first drain terminal connected to the second resistor as an output terminal.

2. An over-voltage protection circuit according to claim 1, wherein said switching means includes a second high breakdown voltage MOS transistor having a second source terminal connected to the external power supply terminal, a second drain terminal connected to the internal power supply terminal, and a second gate terminal connected to the first drain terminal of the signal generating means.

3. An over-voltage protection circuit according to claim 2, wherein said first and second high breakdown voltage MOS transistors are a P-type transistor.

4. An over-voltage protection circuit according to claim 2, further comprising the integrated circuit protected by the over-voltage protection circuit, said integrated circuit comprising MOSFETS formed on the semiconductor substrate.

* * * * *